United States Patent [19]
Pathak et al.

[11] Patent Number: 5,680,346
[45] Date of Patent: Oct. 21, 1997

[54] HIGH-SPEED, NON-VOLATILE ELECTRICALLY PROGRAMMABLE AND ERASABLE CELL AND METHOD

[75] Inventors: Saroj Pathak, Los Altos Hills; James E. Payne, Boulder Creek, both of Calif.

[73] Assignee: Atmel Corporation, San Jose, Calif.

[21] Appl. No.: 672,299

[22] Filed: Jun. 28, 1996

Related U.S. Application Data

[63] Continuation of Ser. No. 501,270, Jul. 11, 1995, abandoned, which is a continuation of Ser. No. 235,361, Apr. 29, 1994, abandoned.

[51] Int. Cl.$^6$ ............................................. G11C 7/00
[52] U.S. Cl. ................... 365/185.1; 365/51; 365/63; 365/185.14; 365/185.33; 365/189.01
[58] Field of Search ....................... 365/185.1, 185.14, 365/185.33, 189.01, 51, 63

[56] References Cited

U.S. PATENT DOCUMENTS

| | | | |
|---|---|---|---|
| 4,094,012 | 6/1978 | Perlegos et al. | 365/226 |
| 4,114,255 | 9/1978 | Salsbury et al. | 29/571 |
| 4,486,859 | 12/1984 | Hoffman | 365/185 |
| 4,611,309 | 9/1986 | Chuang et al. | 365/185 |
| 4,695,979 | 9/1987 | Tuvell et al. | 365/185.1 |
| 4,725,983 | 2/1988 | Terada | 365/185.08 |
| 5,005,155 | 4/1991 | Radjy et al. | 365/185 |
| 5,075,885 | 12/1991 | Smith et al. | 365/189.05 |
| 5,081,054 | 1/1992 | Wu et al. | 437/43 |
| 5,086,325 | 2/1992 | Schumann et al. | 357/23.5 |
| 5,101,378 | 3/1992 | Radjy et al. | 365/185 |
| 5,329,487 | 7/1994 | Gupta et al. | 365/185 |
| 5,331,590 | 7/1994 | Josephson et al. | 365/182 |
| 5,379,254 | 1/1995 | Chang | 365/185 |
| 5,399,891 | 3/1995 | Yiu et al. | 365/185 X |

FOREIGN PATENT DOCUMENTS

| | | |
|---|---|---|
| 0284724A2 | 10/1988 | European Pat. Off. . |
| 0426282A2 | 5/1991 | European Pat. Off. . |
| WO 82/02275 | 7/1982 | WIPO . |
| WO90/15412 | 12/1990 | WIPO . |

*Primary Examiner*—Do Hyun Yoo
*Attorney, Agent, or Firm*—Thomas Schneck; Mark Protsik

[57] ABSTRACT

A non-volatile programmable circuit having programming and read bitlines, a non-volatile memory cell, and a read select transistor, and a method for its operation. The non-volatile memory cell is programmable through the programming bitline. The read select transistor is connected between the non-volatile memory cell and the read bitline. During read operation, the programming bitline is grounded and programmed information is readable onto the read bitline. During programming operation, the read bitline is grounded, and programmed information is programmable into the non-volatile memory cell for storage and retention.

11 Claims, 2 Drawing Sheets

HIGH-SPEED, NON-VOLATILE ELECTRICALLY PROGRAMMABLE AND ERASABLE CELL AND METHOD

This application is a continuation of copending application Ser. No. 08/501,270 filed on Jul. 11, 1995, now abandoned, which is a continuation of application Ser. No. 08/235,361 filed on Apr. 29, 1996, now abandoned.

TECHNICAL FIELD

The field of the invention is that of high-speed, non-volatile, electrically programmable and erasable cells and methods for their operation.

BACKGROUND ART

Electrically programmable and erasable cells of many kinds are well known in the semiconductor arts. Such cells find widespread application as key elements in programmable logic devices, field programmable gate arrays, flash memories and electrically erasable programmable read only memories.

FIG. 1 illustrates a typical non-volatile cell 10 of the prior art for use with electrically erasable programmable read only memories and flash memories. The non-volatile cell 10 shown includes a select transistor 12 and a floating gate transistor 14, which are connected in series between a bitline 16 and a ground connection. Floating gate transistor 14 of FIG. 1 is an n-channel depletion-type device. Select transistor 12 and floating gate transistor 14 are typically nmos field effect transistors. Each has a control gate effective for controlling the passage of electric current depending upon the voltage applied to the control gate. The control gate of select transistor 12 is driven by a wordline 20, and the control gate of floating gate transistor 14 is connected to a reference line 22 supplying a reference voltage effective for selective activation of floating gate transistor 14.

Select transistor 12 shown in FIG. 1 permits selection and accessing of selected non-volatile cell 10 and is connected to bitline 16 through which the logical state of non-volatile cell 10 can be detected or sensed. Select transistor 12 is preferably an n-channel device, and its drain is connected to bitline 16. The source of select transistor 12 is further connected to floating gate transistor 14 which holds the signal information subject to detection or sensing. A select signal on wordline 20 is effective for causing select transistor 12 to conduct current, permitting access to floating gate transistor 14. This permits the logical state of floating gate transistor 14 to be detected or sensed through bitline 16. Floating gate transistor 14 is fabricated with tunnel oxide and n+ doping on its drain connection. The source connection of floating gate transistor 14 is grounded in the typical case.

Certain disadvantages characterize the structure of the typical non-volatile cell 10 of the prior art as shown in FIG. 1. These disadvantages apply particularly with respect to programmable logic device applications, in which speed of operation is particularly essential. Speed of operation of select transistor 12 is critical, especially with regard to the reading and the programming of non-volatile cell 10. In order for select transistor 12 to perform key functions in the reading and programming of non-volatile cell 10, it is fabricated with a thick oxide layer and a long channel length between source and drain. Select transistor 12 is not optimized for speed of operation, because the long channel and the thick oxide layer tend to slow operation. Select transistor 12 is further hampered by its low current drive capabilities. This makes it particularly slow at three (3) volts, which is the new power supply standard for many semiconductor applications.

The non-volatile cell 10 shown in FIG. 1 further suffers in the construction of floating gate transistor 14. Floating gate transistor 14 relies upon tunnel oxide and n+ diffusion in its drain region. This establishes a high level of capacitive loading on bitline 16 with attendant disadvantages during high speed operation. This is particularly troublesome, because in the case of programmable logic devices, half of the wordlines are "on," at any given time. Thus, a selected non-volatile cell 10 has to charge or discharge the n+ and tunnel oxide capacitance of the connected bitlines in order effectively to operate. However, the difficulty in effectively discharging against the tunnel oxide capacitance considerably slows operation.

It is accordingly an object of the invention to develop a fast and effective cell structure and organization for high speed operation in the fields of programmable logic devices, field programmable gate arrays, flash memories, and electrically erasable programmable read only memories.

It is further an object of the invention to avoid the effects of tunnel oxide capacitance and n+ concentrations in the transistors of typical cell arrangements of the prior art.

SUMMARY OF THE INVENTION

The above objects have been achieved in an arrangement and architecture of a non-volatile electrically programmable and erasable cell for high speed devices, which provides separate programming and read paths to different bitlines. In particular, according to the arrangement of the invention, in order to increase operating speed, separate programming and read bitlines are employed to program the non-volatile cell and read its memory contents. Additionally, read operation is conducted through the drain of the cell arrangement rather than through the source of the cell, the drain being defined as the side of the cell arrangement connected to the read bitline.

In order to implement the invention herein, an additional read select transistor is connected to the non-volatile cell in series therewith and leading to a read bitline. The cell may include a programming select and a floating gate transistor. Accordingly, the cell and the additional read select transistor are connected respectively to the programming and read bitlines, effective to accomplish both programming and read functions for the cell along different and separate paths, one path leading to the programming bitline and the other leading to the read bitline. Thus, cell programming may be conducted through the programming select transistor in the cell or directly with the cell's floating gate transistor, depending on whether the floating gate transistor is an n-channel depletion device or a p-channel enhancement device and whether the cell includes a programming select transistor. On the other hand, read operation is conducted through the read select transistor which is connected to the read bitline. This two-bitline approach considerably enhances the operational speed of the non-volatile cell and reduces the power consumed by the cell during operation.

BEST MODE FOR CARRYING OUT THE INVENTION

Figures 1, 2, 3:
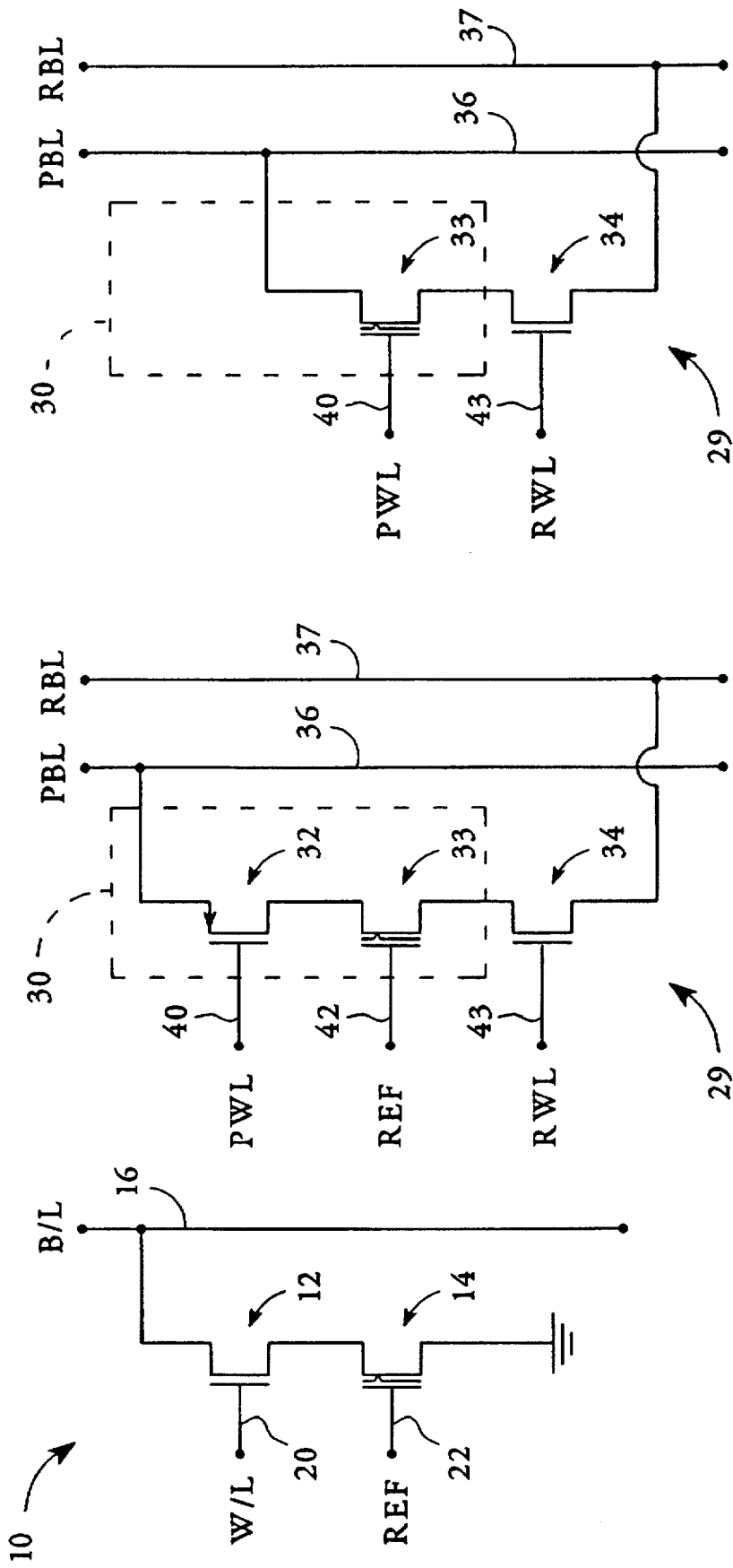
FIG. 1 shows a traditional non-volatile cell of the prior art which can be employed with an electrically erasable programmable read only memory or with flash memories, for example.
FIG. 2 shows a non-volatile electrically erasable programmable read only memory cell, for high speed applications in accordance with the invention.
FIG. 3 shows another non-volatile electrically erasable programmable read only memory cell according to the invention, which is suited for high speed operation.

FIG. 2 illustrates the architecture of an electrically erasable programmable read only memory arrangement 29, including a non-volatile cell 30, according to the invention herein. Non-volatile cell 30 may include a programming select transistor 32 and a floating gate transistor 33. Programming select transistor 32 preferably has an oxide layer about 300 to 400 Angstrom thick. The oxide layer for programming select transistor 32 may however be from about 250 to 450 Angstrom thick. The programming select transistor 32 is also characterized by a channel which is at least 1.8 μm wide.

Memory arrangement 29 further includes a read select transistor 34, connected in series with the non-volatile cell 30 between a programming bitline 36 and a read bitline 37. Read select transistor 34 preferably has an oxide layer about 150 Angstrom thick, much thinner than the oxide layer of the programming select transistor 32. The preferred range of thickness of the read select transistor 34 according to the invention is between approximately 100 to 200 Angstrom. The read select transistor 34 has a narrow channel, typically between 0.6 and 0.8 μm wide. These characteristics ensure fast read operation. Transistors 32, 33, and 34, according to a preferred version of the invention, are field effect transistors, and each of them has a control gate.

The control gate of select transistor 32 is connected to a programming wordline 40. Further, the control gate of the floating gate transistor 33 is connected to a reference line 42 which is selectively applied to activate floating gate transistor 33. Finally, the control gate of read select transistor 34 is connected to a read wordline 43. Programming select transistor 32 is connected to programming bitline 36. Programming select transistor 32 is preferably an n-channel device. The drain of programming select transistor 32 is connected to programming bitline 36. The source of programming select transistor 32 is connected to floating gate transistor 33. A signal on programming wordline 40 is effective for permitting programming select transistor 32 to activate, permitting the logical state of floating gate transistor 33 to be programmed through programming bitline 36. Floating gate transistor 33 is fabricated with tunnel oxide in its drain region.

During read operation, the programming wordline 40 is set to VCC; the programming bitline 36 is grounded; and reading is accomplished via the read bitline 37. Since the read select transistor 34 never sees high voltage, its input wordline, i.e., read wordline 43, can be optimized for speed. Further, since read wordline 43 is not subject to high voltages, e.g., up to 20 volts, required for programming, any input circuitry connected to read wordline 43 can be speed optimized by having shortened channel widths and thinner oxide layers. In particular, the tunnel oxide and n+ diffusion are on the source side during read operation. Accordingly, there is no need for charge-up prior to read operation, considerably speeding read operations. Likewise, the read bit line 37 never sees high voltage, so both it and the sense amplifier circuitry connected to it can be optimized for speed.

FIG. 3 shows an alternate embodiment of the electrically erasable programmable read only memory arrangement 29 according to the invention, in which the select transistor 32 of FIG. 2 is eliminated as unnecessary, and floating-gate transistor 33 is an n-channel enhancement transistor which is gate driven directly by programming wordline 40. Further, floating-gate transistor 33 is connected directly in series between read select transistor 34 and programming bitline 36. Otherwise, the advantages and features of FIG. 3 with read wordline 43 and read bitline 37 both optimized for high speed and coupled to read select transistor 34 are similar to those of FIG. 2.

Figure 4:
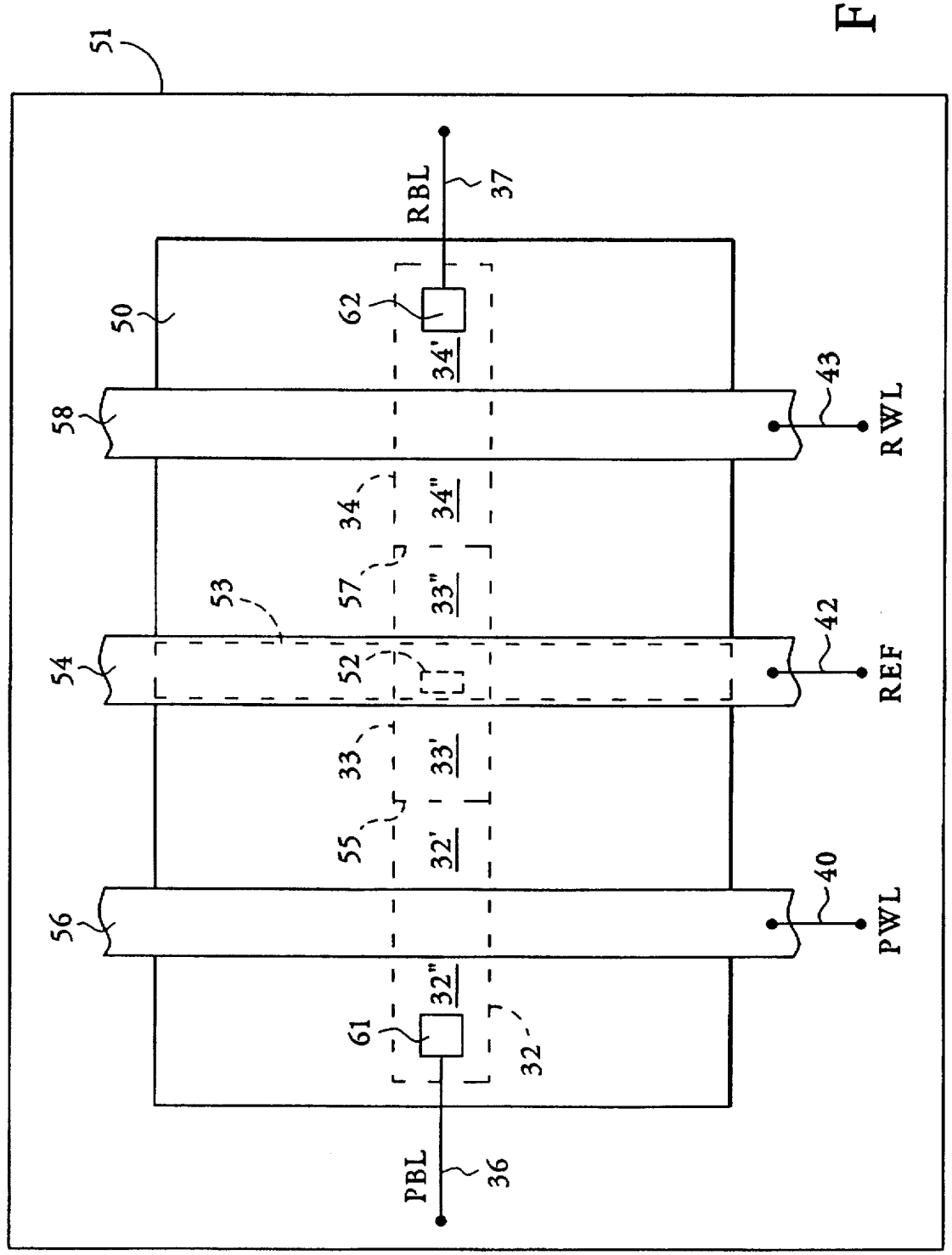
FIG. 4 shows the topography of the non-volatile electrically erasable read only memory cell of FIG. 2.

FIG. 4 shows the silicon topography for implementing a version of the invention as set forth in FIG. 2. The topography shown is directed toward a single cell including floating-gate transistor 33, programming select transistor 32 and read select transistor 34. These three devices are shown in the topography of FIG. 4. Transistor 32 has source and drain regions, respectively, 32' and 32". Similarly, transistor 33 has drain and source regions, respectively, 33' and 33". Finally, transistor 34 has source and drain regions, respectively, 34' and 34".

The arrangement includes a diffusion layer 50 deposited on a substrate 51. A tunnel oxide patch 52 is deposited over the diffusion layer 50 according to a defined, preferably rectangular pattern to comprise part of floating-gate transistor 33. Three vertical strips, respectively 54, 56, and 58 are the remnants of poly 2 and poly 3 semiconductor layers (i.e., polysilicon layers), each of which is deposited according to well-known processes in the semiconductor arts. A central vertical strip 53 under vertical strip 54 and comprised of poly 1 layer within the bounds of diffusion layer 50 is deposited directly over diffusion layer 50. The poly 1 layer of central vertical strip 53 is deposited over tunnel oxide patch 52 of the floating gate transistor.

Each poly layer is preceded during fabrication by predeposit of an oxide layer thereunder. As vertical strips 53 and 54 comprise, respectively, two poly layers, poly 1 and poly 2, there will, in addition to tunnel oxide patch 52, be applied two other oxide layers under corresponding poly layers 1 and 2. The oxide thicknesses applicable are preferably about 85 Angstrom thick for the tunnel oxide patch 52, about 200–300 Angstrom for the oxide under the poly 1 layer, and about 300–400 for the oxide under the poly 2 layer.

The topography of FIG. 4 additionally includes first and second contacts, respectively 61 and 62, which are fabricated on diffusion layer 50. First contact 61 is connected to the programming bit line 36 and second contact 62 is connected to the read bitline 37. Third vertical strip 58 is made from the poly 3 layer and is relatively thin in terms of its underlying oxide layer, which is preferably about 150 Angstrom thick and may according to the invention be between about 100 Angstrom to about 200 Angstrom thick.

Vertical strip 58 constitutes the read wordline 43 and serves as the gate of the read select transistor, substantially increasing its speed as a result of the thinner oxide layer under the poly 3 layer. The gate of the read select transistor 34 is activated by voltages on the order of 5 volts during read select operation. Vertical strip 54 is the reference line 42 or gate input to the floating gate transistor 33. Vertical strip 56 is the programming wordline 40 input for the program 32. Region 55 of diffusion layer 50 is the connection between program select transistor 32 and the floating gate transistor 33. Region 57 of diffusion layer 50 is the connection between the floating gate transistor 33 and the read select transistor 34.

In summary, according to the multibitline arrangement of the invention, high speed operations are enabled by providing separate paths for information flow to and from non-volatile cell 30 during reading and programming phases of operation. This flexibility of operation, provided by two-bitline structural enhancements results in effective operation of non-volatile cell 30 at higher speeds than possible in the prior art.

We claim:

1. A non-volatile programmable circuit comprising:
   (a) a programming bitline for programing a non-volatile memory cell,
   (b) a read bitline for reading the contents of the non-volatile memory cell,
   (c) the non-volatile memory cell including a floating gate transistor of the type being a field effect device having one and only one source region and one and only one drain region spaced apart from one another with a thin tunnel oxide patch disposed over said drain region, a first polysilicon layer disposed over an area between said spaced apart source and drain regions and over a portion of said drain region including over said tunnel oxide patch, said first polysilicon layer forming a floating gate associated only with said field effect device with a first oxide layer under said first polysilicon layer exclusive of said tunnel oxide patch, said device also having a second polysilicon layer forming a control gate disposed over said first polysilicon layer with a second oxide layer over said first polysilicon layer and under said second polysilicon layer, the drain region of said floating gate transistor connected to said programming bitline, said non-volatile memory cell being effective for retaining programmed information from said programming bitline, and
   (d) read select means for selective connection of said non-volatile memory cell to said read bitline, said read select means being connected in series between said source region of said floating gate transistor of said non-volatile memory cell and said read bitline such that said source region of said floating gate transistor of said non-volatile memory cell forms a non-branching connection to said read select means, said read select means having a control gate disposed over a third oxide layer and being distinct from both said floating gate and said control gate of said floating gate transistor for controlling, in cooperation with said control gate of said floating gate transistor, the passage of electric current through said non-volatile memory cell and said read select means, said second oxide layer being at least twice as thick as said third oxide layer, said control gate of said read select means being drivable separately from said control gate of said floating gate transistor, and said read select means being effective for enabling reading of said memory cell in response to a read signal on the control gate of said read select means.

2. A non-volatile programmable circuit according to claim 1, wherein said read select means includes an n-channel transistor.

3. A non-volatile programmable circuit according to claim 2, wherein the source region of said floating-gate transistor is connected to a drain of said n-channel transistor.

4. A non-volatile programmable circuit according to claim 1, wherein said floating-gate transistor is capable of being programmed from said programming bitline by bringing the control gate of said floating gate transistor and Said programming bitline to a high voltage state, while grounding said read bitline and applying at most Vcc to the control gate of said read select means.

5. A non-volatile programmable circuit according to claim 1, wherein said floating-gate transistor is capable of being read through the read bitline, while the programming bitline is grounded and a programming wordline connected to said control gate of said floating gate transistor is set to Vcc.

6. A method of operating a non-volatile programmable circuit receiving a power supply Vcc comprising:
   (a) connecting a non-volatile memory cell and a read select transistor in series between a programming bitline and a read bitline, said non-volatile memory cell including a floating gate transistor with a control gate, one source, one drain and a floating gate, said floating gate being coupled only to said one drain, said one source and said control gate, said floating gate transistor further having a first oxide disposed in between said control gate and said floating gate, said source of said floating gate transistor forming a non-branching connection to said read select transistor, said read select transistor having a gate that is distinct and separately drivable from every gate of said non-volatile memory cell, the gate of said read select transistor being disposed over a second oxide, said first oxide being at least twice as thick as said second oxide,
   (b) programming memory state information from said programming bitline onto said floating gate transistor of said non-volatile memory cell through said drain of said floating gate transistor while said read bitline is grounded and at most Vcc is applied to the gate of said read select transistor, and
   (c) reading memory state information from said non-volatile memory cell through said read select transistor for application onto said read bitline while said programming bitline is grounded.

7. A non-volatile programmable circuit cell comprising:
   a floating gate transistor circuit consisting only of a floating gate transistor having a programming gate disposed over a first oxide, one source, one drain and a floating gate, said floating gate being coupled only to said drain, said source and said programming gate,
   said non-volatile programmable circuit cell further including a read transistor circuit connected in series with said floating gate transistor between separate programming and read bitlines such that said drain of said floating gate transistor is connected to said programming bitline and said source of said floating gate transistor forms a non-branching connection to said read transistor circuit, said read transistor circuit having a read transistor control gate that is disposed over a second oxide and that is distinct and separately drivable from every gate of said floating gate transistor circuit, said first oxide being disposed between the floating gate and the programming gate and further being at least twice as thick as said second oxide.

8. The programmable circuit cell according to claim 7, wherein said read transistor circuit comprises said read transistor control gate which is drivable by a read wordline.

9. A two control input non-volatile programmable circuit comprising:
   (a) a programming bitline for programming a non-volatile memory cell,
   (b) a read bitline for reading the contents of said non-volatile memory cell,
   (c) only two control inputs defined as a program control input and a memory select input,
   (d) said non-volatile memory cell consisting of only a floating gate transistor having a source electrode and a drain electrode, said drain electrode connected to said programming bitline, said non-volatile memory cell being effective for retaining programmed information from said programming bitline, and (e) read select means for selective connection of said non-volatile memory cell to said read bitline, said read select means being connected in series with said non-volatile memory cell between said programming bitline and said read bitline such that said source electrode of said non-volatile memory cell forms a non-branching connection to said read select means, said non-volatile memory cell having a first control gate coupled to said program control input and further disposed over a first oxide having a first thickness and said read select means having a second control gate distinct from said first control gate and coupled to said memory select input, said second control gate being disposed over a second oxide having a second thickness less than half as thick as said first oxide, said first oxide being disposed between the floating gate and the first control gate, said first and second control gates being effective for controlling the passage of electric current respectively through said non-volatile memory cell and said read select means, and said read select means being effective for enabling reading of said memory cell in response to a read signal on said second control gate.

10. A two control input non-volatile programmable circuit according to claim 9 including a power supply Vcc, said floating-gate transistor being responsive to said first control gate and being capable of being programmed from said programming bitline by bringing said first control gate and said programming bitline to a voltage state higher than said Vcc, while grounding said read bitline.

11. A two control input non-volatile programmable circuit according to claim 9, wherein said floating-gate transistor is capable of being read through the read bitline, while the programming bitline is grounded and said first control gate of said non-volatile memory cell is set equal to Vcc.

* * * * *

UNITED STATES PATENT AND TRADEMARK OFFICE
CERTIFICATE OF CORRECTION

PATENT NO. : 5,680,346

DATED : October 21, 1997

INVENTOR(S) : Saroj Pathak et al.

It is certified that error appears in the above-identified patent and that said Letters Patent is hereby corrected as shown below:

Column 1, line 8, "Apr. 29, 1996, now abandoned." should read - - April 29, 1994, now abandoned. - -.

Column 4, line 58, "program 32" should read - - program select transistor 32 - -.

Claim 1, column 5, line 37, "memory call" should read - - memory cell - -.

Claim 4, column 5, line 61, "and Said" should read - - and said - -.

Signed and Sealed this

Seventeenth Day of March, 1998

Attest:

BRUCE LEHMAN

Attesting Officer

Commissioner of Patents and Trademarks